(12) United States Patent
Lee et al.

(10) Patent No.: US 12,268,106 B2
(45) Date of Patent: Apr. 1, 2025

(54) NONVOLATILE MEMORY DEVICE AND OPERATING METHOD OF THE SAME

(71) Applicants: Samsung Electronics Co., Ltd., Suwon-si (KR); President and Fellows Of Harvard College, Cambridge, MA (US)

(72) Inventors: Minhyun Lee, Suwon-si (KR); Houk Jang, Cambridge, MA (US); Donhee Ham, Cambridge, MA (US); Chengye Liu, Cambridge, MA (US); Henry Hinton, Cambridge, MA (US); Haeryong Kim, Seongnam-si (KR); Hyeonjin Shin, Suwon-si (KR)

(73) Assignees: Samsung Electronics Co., Ltd., Gyeonggi-do (KR); President and Fellows Of Harvard College, Cambridge, MA (US)

( * ) Notice: Subject to any disclaimer, the term of this patent is extended or adjusted under 35 U.S.C. 154(b) by 0 days.

(21) Appl. No.: 18/167,354

(22) Filed: Feb. 10, 2023

(65) Prior Publication Data
US 2023/0189673 A1   Jun. 15, 2023

Related U.S. Application Data

(63) Continuation of application No. 17/094,121, filed on Nov. 10, 2020, now Pat. No. 11,600,774.
(Continued)

(30) Foreign Application Priority Data
Jan. 28, 2020   (KR) .................... 10-2020-0010030

(51) Int. Cl.
*H10N 70/00*   (2023.01)
*H10B 63/00*   (2023.01)

(52) U.S. Cl.
CPC ......... *H10N 70/8836* (2023.02); *H10B 63/84* (2023.02); *H10N 70/011* (2023.02); *H10N 70/841* (2023.02); *H10N 70/8845* (2023.02)

(58) Field of Classification Search
CPC ................................................ H10N 70/8836
See application file for complete search history.

(56) References Cited

U.S. PATENT DOCUMENTS

| | | |
|---|---|---|
| 9,761,636 B2 | 9/2017 | Lee et al. |
| 10,186,545 B2 | 1/2019 | Lee et al. |

(Continued)

FOREIGN PATENT DOCUMENTS

| | | |
|---|---|---|
| EP | 2882005 A1 | 6/2015 |
| JP | 2002-057384 A | 2/2002 |

(Continued)

OTHER PUBLICATIONS

Javier del Valle, et al., "Challenges in materials and devices for resistive-switching-based neuromorphic computing," Journal of Applied Physics, 124, 211101 (2018).

(Continued)

*Primary Examiner* — Moazzam Hossain
*Assistant Examiner* — Hajar Kolahdouzan
(74) *Attorney, Agent, or Firm* — Harness, Dickey & Pierce, P.L.C.

(57) ABSTRACT

A nonvolatile memory device includes a resistance switching layer, a gate on the resistance switching layer, a gate oxide layer between the resistance switching layer and the gate, and a source and a drain, spaced apart from each other, on the resistance switching layer. A resistance value of the resistance switching layer is changed based on an illumination of light irradiated onto the resistance switching layer and is maintained as a changed resistance value.

11 Claims, 13 Drawing Sheets

Related U.S. Application Data

(60) Provisional application No. 62/937,850, filed on Nov. 20, 2019.

(56) References Cited

U.S. PATENT DOCUMENTS

| | | | |
|---|---|---|---|
| 10,204,907 | B2 | 2/2019 | Leobandung et al. |
| 10,217,798 | B2 | 2/2019 | Hu et al. |
| 10,396,126 | B1 | 8/2019 | Kim et al. |
| 2016/0020280 | A1* | 1/2016 | Heo ............... H01L 31/028 257/27 |
| 2016/0037098 | A1 | 2/2016 | Lee et al. |
| 2016/0204162 | A1 | 7/2016 | Hu et al. |
| 2016/0372615 | A1 | 12/2016 | Yang et al. |
| 2017/0243913 | A1 | 8/2017 | Lee et al. |
| 2018/0129043 | A1 | 5/2018 | Kim et al. |
| 2018/0166495 | A1* | 6/2018 | Ang ............... H10N 70/826 |
| 2019/0051825 | A1 | 2/2019 | Vasquez et al. |
| 2019/0157491 | A1 | 5/2019 | Jo et al. |
| 2019/0164597 | A1 | 5/2019 | Afzali-Ardakani et al. |

FOREIGN PATENT DOCUMENTS

| | | |
|---|---|---|
| JP | 2015-109442 A | 6/2015 |
| JP | 2016-025356 A | 2/2016 |
| JP | 2019-003546 A | 1/2019 |
| KR | 10-1997-0007134 | 5/1997 |
| KR | 10-2010-0006033 A | 1/2010 |
| KR | 10-2013-0006873 A | 1/2013 |
| KR | 10-2014-0047512 A | 4/2014 |
| KR | 10-2015-0061898 A | 6/2015 |
| KR | 10-2016-0017168 A | 2/2016 |
| KR | 10-1646017 B1 | 8/2016 |
| KR | 10-2017-0099657 A | 9/2017 |
| KR | 10-2018-0025203 A | 3/2018 |
| KR | 10-2018-0063552 A | 6/2018 |
| KR | 10-1917540 | 11/2018 |
| KR | 10-2019-0065145 A | 6/2019 |
| WO | WO-2014/034420 A1 | 3/2014 |
| WO | WO-2015/072196 A1 | 5/2015 |
| WO | 2019/064215 A1 | 4/2019 |
| WO | WO-2019/212488 A1 | 11/2019 |

OTHER PUBLICATIONS

Niels Chr. Hansen, et al., "Commentary: Predictions and the brain: how musical sounds become rewarding," frontiers in Human Neuroscience, General Commentary, vol. 11, Article 168, Apr. 5, 2017.

Seunghwan Seo, et al., "Artificial optic-neural synapse for colored and color-mixed pattern recognition," Nature communications, Article, DOI: 10.1038/s41467-018-07572-5, 2018.

Feichi Zhou et al., "Optoelectronic resistive random access memory for neuromorphic vision sensors," Nature nanotechnology, Articles, vol. 14, Aug. 2019.

Mirko Hansen, et al., "Double-Barrier Memristive Devices for Unsupervised Learning and Pattern Recognition," frontiers in Neuroscience, Original Research, vol. 11, Article 91, Feb. 28, 2017.

Non-Final Rejection issued Nov. 27, 2020 in Korean Application No. 10-2020-0010030.

Extended European Search Report issued Mar. 23, 2021 in European Patent Application No. 20208586.6.

Non-Final Office Action issued May 25, 2022 in U.S. Appl. No. 17/094,121.

Notice of Allowance issued Oct. 26, 2022 in U.S. Appl. No. 17/094,121.

Notice of Grounds of Rejection issued Oct. 21, 2024 in Japanese Application No. 2020-192343.

* cited by examiner $$Y_k = \sum_{i=1}^{n} W_{ik} * X_i$$

$$\begin{bmatrix} X_1 \\ X_2 \\ \vdots \\ X_n \end{bmatrix}^T \begin{bmatrix} W_{11} & W_{12} & \cdots & W_{1m} \\ W_{21} & W_{22} & \cdots & W_{2m} \\ \vdots & \vdots & \cdots & \vdots \\ W_{n1} & W_{n2} & \cdots & W_{nm} \end{bmatrix}$$

$$= \begin{bmatrix} Y_1 & Y_2 & \cdots & Y_m \end{bmatrix}$$

NONVOLATILE MEMORY DEVICE AND OPERATING METHOD OF THE SAME

CROSS-REFERENCE TO RELATED APPLICATIONS

This application is a Continuation of U.S. application Ser. No. 17/094,121, filed on Nov. 10, 2020, which claims the benefit of U.S. Provisional Application No. 62/937,850, filed on Nov. 20, 2019, in the US Patent Office and Korean Patent Application No. 10-2020-0010030, filed on Jan. 28, 2020, in the Korean Intellectual Property Office, the disclosures of each of which are incorporated herein in their entireties by reference.

BACKGROUND

1. Field

The present disclosure relates to nonvolatile memory devices and operating methods of the same.

2. Description of Related Art

Nonvolatile memory devices, which are semiconductor memory devices, maintain information stored thereon even when the power is turned off, and thus may allow the stored information to be accessed and/or used again when power is supplied thereto. Nonvolatile memory devices may be used in cell phones, digital cameras, personal digital assistants (PDAs), mobile computers, fixed computers, and other devices.

Recently, researches have been carried out to use nonvolatile memory devices in chips included in next-generation neuromorphic computing platforms or neural networks.

In particular, there is a need for nonvolatile memory devices having photoconductivity (PC).

SUMMARY

Provided are nonvolatile memory devices and operating methods of the same. Provided are computer-readable recording media having recorded thereon a program for executing the methods on a computer. The technical problems to be solved are not limited to the above technical problems, and thus other technical problems may be solved.

Additional aspects will be set forth in part in the description which follows and, in part, will be apparent from the description, or may be learned by practice of the presented embodiments of the disclosure.

According to a first aspect of some example embodiments, a nonvolatile memory device includes: a resistance switching layer having a resistance value, the resistance switching layer configured to change the resistance value based on an illumination of light irradiated thereto, and the resistance switching layer configured to maintain the changed resistance value; a gate on the resistance switching layer; a gate oxide layer between the resistance switching layer and the gate; and a source and a drain, spaced apart from each other, on the resistance switching layer.

The gate may include a transparent conducting electrode (TCE) gate above the resistance switching layer and configured to transmit the irradiated light.

The resistance switching layer may include a 2-dimension (2D) material, the 2D material may include at least one of a transition metal dichalcogenide (TMD), silicene, phosphorene (black phosphorus), or graphene.

The resistance switching layer may be formed as a single-layer or a multi-layer.

The resistance switching layer may include a 3-dimension (3D) material; the 3D material may include at least one of germanane, silicene, a group III-V semiconductor, or IGZO.

The gate oxide layer may be formed as a multi-layer, wherein the multi-layer may include a charge trapping layer.

The change of the resistance value of the resistance switching layer may includes, in a state in which an off-voltage is applied to the gate, decreasing the resistance value of the resistance switching layer as the illumination of the light irradiated to the resistance switching layer increases.

The resistance switching layer may be configured to reset when an on-voltage is applied to the gate.

According to a second aspect of another example embodiment, a method of performing an operation using a crossbar array including a plurality of nonvolatile memory devices includes: applying an off-voltage to a gate of each of the plurality of nonvolatile memory devices; changing a resistance value of a resistance switching layer of each of the plurality of nonvolatile memory devices by irradiating light having illumination corresponding to a plurality of elements to the plurality of nonvolatile memory devices; and applying a gate off-voltage to at least one row of the crossbar array and obtaining a source current from each column of the crossbar array.

The irradiated light may correspond to a plurality of pixels included, and the operation may include obtaining the image by applying the gate off-voltage to each row of the crossbar array and obtaining the source current from each column of the crossbar array.

The irradiated light may correspond to a plurality of pixels included in an image, the irradiating may include sequentially arranging a plurality of color filters on the nonvolatile memory devices and irradiating the light to each of the plurality of nonvolatile memory devices, and the operation may include obtaining intermediate images respectively corresponding to the plurality of color filters by applying the gate off-voltage to each row of the crossbar array and obtaining the source current from each column of the crossbar array; and obtaining a color image by synthesizing the intermediate images.

The irradiating may include irradiating light having illumination corresponding to a plurality of weights included in a specific layer of a neural network to the plurality of nonvolatile memory devices, and the operation may include performing a vector-matrix operation of the specific layer by applying the gate off-voltage to at least one row of the crossbar array and obtaining the source current from each column of the crossbar array.

The irradiating may include shifting a window by a stride on an image and irradiating light having illumination corresponding to the plurality of elements included in the window to each column of the crossbar array.

According to a third aspect of another example embodiment, a method of recognizing an image using a crossbar array including a plurality of nonvolatile memory devices includes: applying an off-voltage to a gate of each of the plurality of nonvolatile memory devices; shifting a window by a stride on an image and irradiating light having illumination corresponding to the image included in the window to each column of the crossbar array; performing a pooling operation by applying a gate off-voltage to at least one row of the crossbar array and obtaining a first source current from each column of the crossbar array; resetting the plurality of nonvolatile memory devices by applying an on-voltage to the gate of each of the plurality of nonvolatile memory device; applying an off-voltage to the gate of each of the reset plurality of nonvolatile memory devices; irradiating light having illumination corresponding to a plurality of weights included in a specific layer of a neural network to the plurality of nonvolatile memory devices; and performing a fully-connected convolution operation by applying, as a drain voltage, a voltage corresponding to the first source current to the at least one row of the crossbar array and obtaining a second source current from each column of the crossbar array; and recognizing the image based on the second source current.

According to a fourth aspect of another example embodiment, a non-transitory computer-readable recording medium has recorded thereon a program, which when executed by a computer, causes the computer to perform the method of the second aspect on a computer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
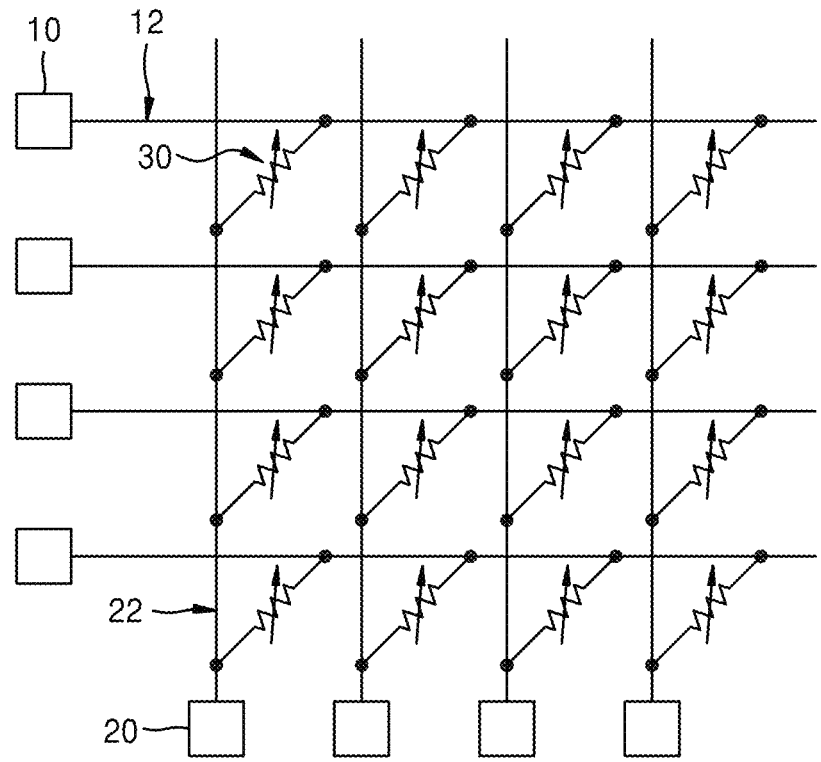
FIGS. 1A and 1B are diagrams for describing an operating method of a crossbar array including a plurality of nonvolatile memory devices according to some example embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The terms "in some example embodiments" and "in an example embodiment" used herein do not necessarily indicate the same embodiment.

Some example embodiments of the present disclosure may be represented by functional blocks and various processing operations. Some or all of such functional blocks may be implemented as various numbers of hardware and/or software components for performing specific functions. For example, the functional blocks of the present disclosure may be implemented using one or more microprocessors, or may be implemented using circuits for predetermined functions. Furthermore, for example, the functional blocks of the present disclosure may be implemented with various programming or scripting languages. The functional blocks may be implemented as algorithms to be executed by one or more processors. Furthermore, the present disclosure may employ typical technologies for electronic environment setting, signal processing, and/or data processing. The terms such as "mechanism," "element," "means", "configuration," and the like may be widely used herein, and are not limited to mechanical and physical configurations.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

When an element is referred to as being "on," another element, the element may be directly on the other element, and/or one or more other intervening elements may be present. In contrast, when an element is referred to as being "directly on," another element there are no intervening elements present. In addition, when an element is referred to as being "between" two elements, the element may be the only element between the two elements, or one or more other intervening elements may be present.

Furthermore, the connection lines or connection members between elements illustrated in the drawings are merely examples of functional connections and/or physical or circuit connections. In actual applications, they may be replaced or embodied as various additional functional connections, physical connections, or circuit connections.

Generally speaking, a computer-accessible medium may include any tangible and/or non-transitory storage media and/or memory media. The term "non-transitory," as used herein, is a limitation of the medium itself (e.g., as tangible, and not a signal) as opposed to a limitation on data storage persistency (e.g., RAM vs. ROM).

Hereinafter, embodiments of the present disclosure will be described in detail with reference to the accompanying drawings.

Figure 1B:
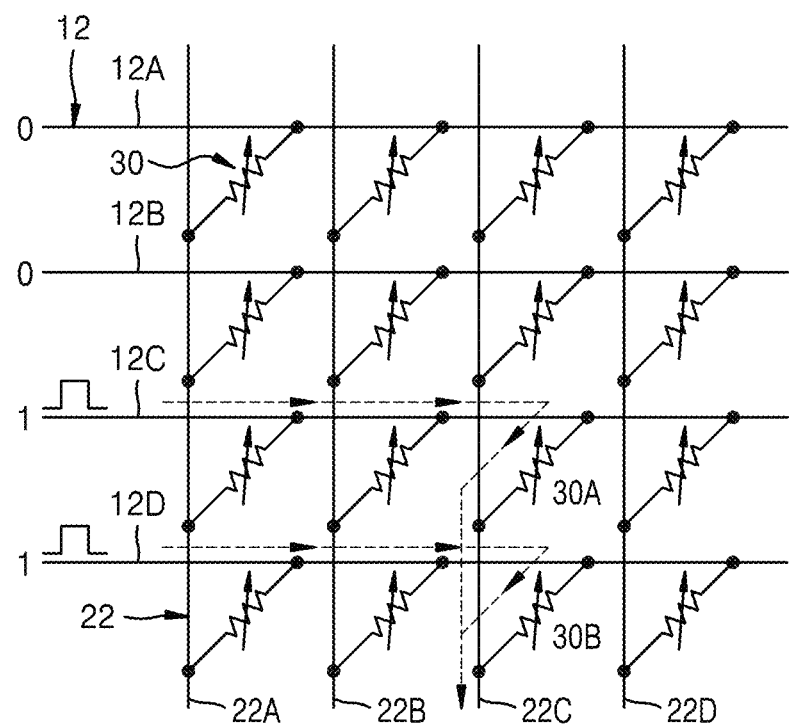

FIGS. 1A and 1B are diagrams for describing a method of operating a crossbar array including a plurality of nonvolatile memory devices according to some example embodiments.

Referring to FIG. 1A, the crossbar array may include a plurality of presynaptic neurons 10, a plurality of postsynaptic neurons 20, and synapses 30 for providing a connection between the plurality of presynaptic neurons 10 and the plurality of postsynaptic neurons 20. The synapse 30 may represent, for example, a nonvolatile memory device.

In some example embodiments, the crossbar array may include four presynaptic neurons 10, four postsynaptic neurons 20, and 16 synapses 30, but the numbers of the foregoing elements may be variously changed. When the number of the presynaptic neurons 10 is N (where N is a natural number greater than or equal to 2) and the number of the postsynaptic neurons 20 is M (where M is a natural number greater than or equal to 2, and may be equal to or different from N), N*M number of synapses 30 may be arranged in a matrix form.

A line 12 may be connected to each of the plurality of presynaptic neurons 10 and may extend in a first direction (for example, a horizontal direction) and a line 22 may be connected to each of the plurality of postsynaptic neurons 20 and may extend in a second direction (for example, a vertical direction) intersecting with the first direction. Hereinafter, for convenience, the line 12 extending in the first direction is referred to as a row line, and the line 22 extending in the second direction is referred to as a column line. The plurality of synapses 30 may be arranged at each intersection point of the row line 12 and the column line 22 to connect the corresponding row line 12 and corresponding column line 22 to each other.

The presynaptic neuron 10 may be configured to generate and to send a signal, for example, a signal corresponding to specific data, to the row line 12, and the postsynaptic neuron 20 may be configured to receive, via the column line 22, a synaptic signal that has passed through the synapse 30, and may process the synaptic signal. The presynaptic neuron 10 may correspond to an axon, and the postsynaptic neuron 20 may correspond to a neuron. However, whether a neuron is a presynaptic neuron 10 or a postsynaptic neuron 20 may be determined according to a relative relationship with another neuron. For example, when the presynaptic neuron 10 receives a synaptic signal from another neuron, the presynaptic neuron 10 may function as a postsynaptic neuron 20. Likewise, when the postsynaptic neuron 20 sends a signal to another neuron, the postsynaptic neuron 20 may function as a presynaptic neuron 10. The presynaptic neuron 10 and the postsynaptic neuron 20 may be implemented as various circuits such as a complementary metal-oxide-semiconductor (CMOS) or the like.

A connection between the presynaptic neuron 10 and the postsynaptic neuron 20 may be established through the synapse 30. The synapse 30 may be a device configured to vary a weight or electrical conductance with an electrical pulse applied to the two ends of the synapse 30, for example, a voltage and/or current.

The synapse 30 may include, for example, a variable resistance device. The variable resistance device, which may be configured to switch between different resistance states according to a voltage or current applied to the two ends of the variable resistance device, may have a single-layer structure or multi-layer structure including various materials that may have a plurality of resistance states, for example, a metal oxide such as a transition metal oxide; perovskite-based material or the like; a phase-change material such as a chalcogenide-based material or the like; and/or a ferroelectric material, a ferromagnetic material, or the like. An operation in which the variable resistance element and/or the synapse 30 changes from a higher resistance state (e.g., a high-resistance state) to a lower resistance state (e.g., a low-resistance state) may be referred to as a set operation, and an operation in which the variable resistance element and/or the synapse 30 changes from a lower resistance state to a higher resistance state may be referred to as a reset operation.

However, the synapse 30 may be implemented to have various characteristics that are different from those of variable resistance devices of memories. For example, unlike the variable resistance devices used in memory devices such as resistance random access memory (RRAM), parameter RAM (PRAM), ferroelectric RAM (FRAM), magnetoresistive RAM (MRAM), and the like, the synapse 30 may exhibit analog behavior in which there is no abrupt change in resistance and the conductance may gradually change according to the number of input electrical pulses during the set operation and reset operation.

Operation of the crossbar array is described below with reference to FIG. 1B. For convenience, the row lines 12 may be sequentially referred to as a first row line 12A, a second row line 12B, a third row line 12C, and a fourth row line 12D from up to down, and the column lines 22 may be sequentially referred to as a first column line 22A, a second column line 22B, a third column line 22C, and a fourth column line 22D from left to right.

Referring to FIG. 1B, in an initial state, all of the synapses 30 may be in a state in which conductance is relatively low, e.g., a high-resistance state. When at least a portion of the plurality of synapses 30 are in a low-resistance state, an initialization operation may switch the portion of the plurality of synapses 30 to the high-resistance state. Each of the plurality of synapses 30 may have a threshold for changing its resistance and/or conductance. For example, a synapse 30 may have a desired (or, alternatively predetermined) threshold for changing its resistance and/or conductance. The synapse 30 may be configured to, for example, not change its conductance when a voltage and/or current less than the threshold is applied to two ends of the synapse 30, and to change its conductance when a voltage and/or current greater than the threshold is applied to the two ends of the synapse 30.

In this state, an input signal corresponding to specific data may be input to the row lines 12 to perform an operation of outputting the specific data as a result of a specific column line 22. Here, the input signal may be indicated by applying electrical pulses to the row lines 12. For example, when the input signal corresponding to data '0011' is input to the row lines 12, an electrical pulse may not be applied to the row lines 12 corresponding to the digit '0' (e.g., the first and second row lines 12A and 12B), and may be applied to the row lines 12 corresponding to the digit '1' (e.g., the third and fourth row lines 12C and 12D). The column line 22 may be driven with an appropriate voltage and/or current to perform the output.

For example, when a column line 22 for outputting the specific data is determined, this column line 22 may be driven so that the synapse 30 located at an intersection point with the row line 12 and the column line 22 and corresponding to the digit '1' may receive a voltage equal to or higher than a voltage required for a set operation (hereinafter referred to as a set voltage Vset), and the remaining column lines 22 may be driven so that the remaining synapses 30 may receive a voltage lower than the set voltage Vset. For example, when the set voltage is Vset, and the column line 22 for outputting the data '0011' is determined as the third column line 22C, a magnitude of an electrical pulse applied to the third and fourth row lines 12C and 12D may be at least Vset and a voltage applied to the third column line 22C may be 0 V so that first and second synapses 30A and 30B located at intersection points between the third column line 22C and the third and fourth row lines 12C and 12D may receive a voltage of at least Vset. Accordingly, the first and second synapses 30A and 30B may be in a lower resistance state. The conductance of the first and second synapses 30A and 30B which are in a lower resistance state may gradually increase as the number of electrical pulses increases. A magnitude and width of an applied electrical pulse may be substantially constant. A voltage applied to the remaining column lines (e.g., the first, second, and fourth lines 22A, 22B, and 22D) may have a value between 0 V and Vset, for example, ½Vset, so that the synapses 30 except for the first and second synapses 30A and 30B may receive a relative voltage lower than Vset. Accordingly, the resistance state of the synapses 30 except for the first and second synapses 30A and 30B may not change. A flow of current and/or electrons for this case is indicated by a dotted arrow in FIG. 1B.

In another example, the column line 22 for outputting specific data may not yet be determined. In this case, a current flowing through each column line 22 may be measured while applying an electrical pulse corresponding to specific data to the row line 12, and the column line 22 of which the current reaches a threshold current earliest, for example, the third column line 22C, may be determined to output the specific data.

In this manner, different pieces of data may be output to different column lines 22 respectively.

Figure 2:
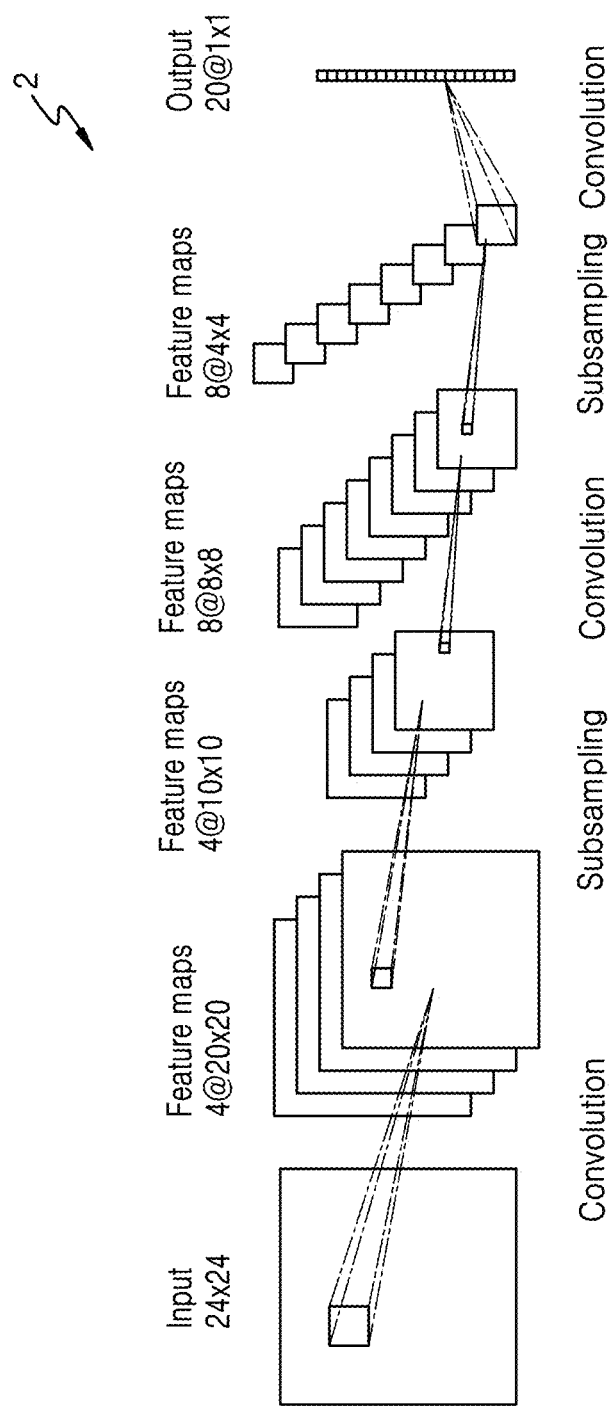
FIG. 2 is a diagram illustrating an architecture of a neural network according to some example embodiments.

FIG. 2 is a diagram illustrating an architecture of a neural network according to some example embodiments.

Referring to FIG. 2, a neural network 2 may have an architecture of a deep neural network (DNN) and/or n-layer neural network. The DNN and/or n-layer neural network may correspond to a convolution neural network (CNN), recurrent neural network (RNN), deep belief network, restricted Boltzmann machine, or the like. For example, the neural network 2 may be implemented as a CNN, an artificial neural network (ANN) system, a deep learning system, deconvolutional neural networks (DCNN), stacked neural networks (SNN), state-space dynamic neural networks (SSDNN), deep belief networks (DBN), generative adversarial networks (GANs), and/or restricted Boltzmann machines (RBM), but is not limited thereto. Alternatively and/or additionally, such machine learning systems may include other forms of machine learning models, such as, for example, linear and/or logistic regression, statistical clustering, Bayesian classification, decision trees, dimensionality reduction such as principal component analysis, and expert systems; and/or combinations thereof, including ensembles such as random forests. Although FIG. 2 illustrates some of convolution layers of a convolution neural network which is an example of the neural network 2, the convolution neural network may further include a pooling layer, a fully connected layer, or the like in addition to the illustrated convolution layers.

The neural network 2 may be implemented with an architecture having a plurality of layers including an input image, feature maps, and output. In the neural network 2, a convolution operation between the input image and a filter referred to as a weight is performed, and feature maps are output as a result of the convolution operation. A convolution operation between the output feature maps as input feature maps and a weight is performed, and new feature maps are output. As a result of repeatedly performing this convolution operation, a result of recognizing features of the input image through the neural network 2 may be output.

For example, when an image having a 24×24 pixel size is input to the neural network 2 of FIG. 2, the input image may be output as 4-channel feature maps having a 20×20 size through a convolution operation between the input image and a weight. Thereafter, the 20×20 feature maps may be reduced in size through a repeated convolution operation between the feature maps and a weight, and features having a 1×1 size may be output finally. The neural network 2 may filter and output robust features capable of representing an entire image from the input image by repeatedly performing a convolution operation and a subsampling (e.g., pooling) operation in multiple layers, and may therefrom derive a result of recognizing the input image through output final features.

Figure 3:
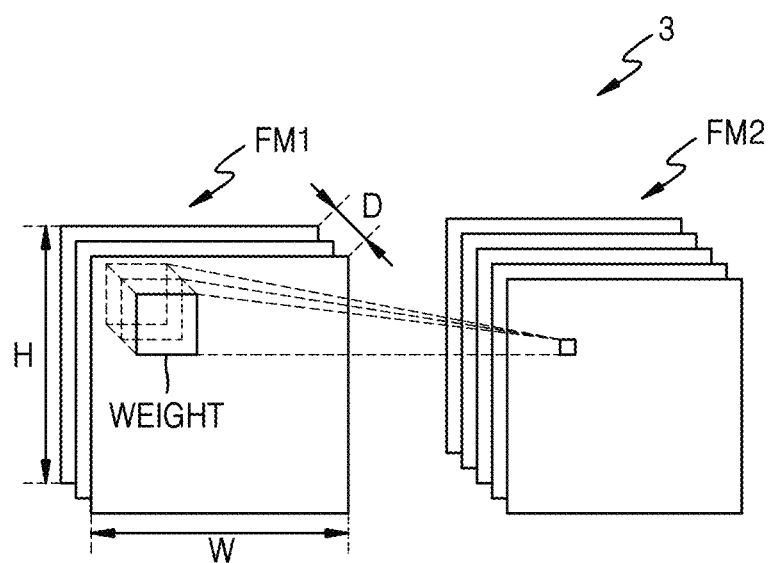
FIG. 3 is a diagram illustrating a relationship between an input feature map and an output feature map in a neural network according to some example embodiments.

FIG. 3 is a diagram illustrating a relationship between an input feature map and an output feature map in a neural network according to some example embodiments.

Referring to FIG. 3, in a layer 3 of a neural network, a first feature map FM1 may correspond to an input feature map, and a second feature map FM2 may correspond to an output feature map. A feature map may represent a data set in which various features of input data are expressed. The feature maps FM1 and FM2 may have elements of a two-dimensional matrix or elements of a three-dimensional matrix, wherein a pixel value may be defined in each element. The feature maps FM1 and FM2 have a width W (e.g., column), a height H (e.g., row), and a depth D. The depth D may correspond, for example, to the number of channels.

A convolution operation may be performed on the first feature map FM1 and a weight, and the second feature map FM2 may be generated as a result of the convolution operation. The weight filters features of the first feature map FM1 through a convolution operation between the weight and the first feature map FM1. The weight is convoluted with windows (and/or tiles) of the first feature map FM1 while shifting the first feature map FM1 in a sliding window manner During each shift, the weight may be multiplied by each of pixel values of overlapped windows in the first feature map FM1 and may be added up. Since the first feature map FM1 and the weight are convoluted, one channel of the second feature map FM2 may be generated. Although a single weight is illustrated in FIG. 3, a plurality of weights may be convoluted with the first feature map FM1 in practice so that the second feature map FM2 of a plurality of channels may be generated.

The second feature map FM2 may correspond to an input feature map of a next layer. For example, the second feature map FM2 may be an input feature map of a pooling (or subsampling) layer.

For convenience, FIGS. 2 and 3 illustrate only a schematic architecture of the neural network 2. However, the neural network 2 may include more or fewer layers, feature maps, and weights, and those of ordinary skill in the art could understand that sizes of the layers, feature maps, and weights may be variously modified.

Figures 4A, 4B:
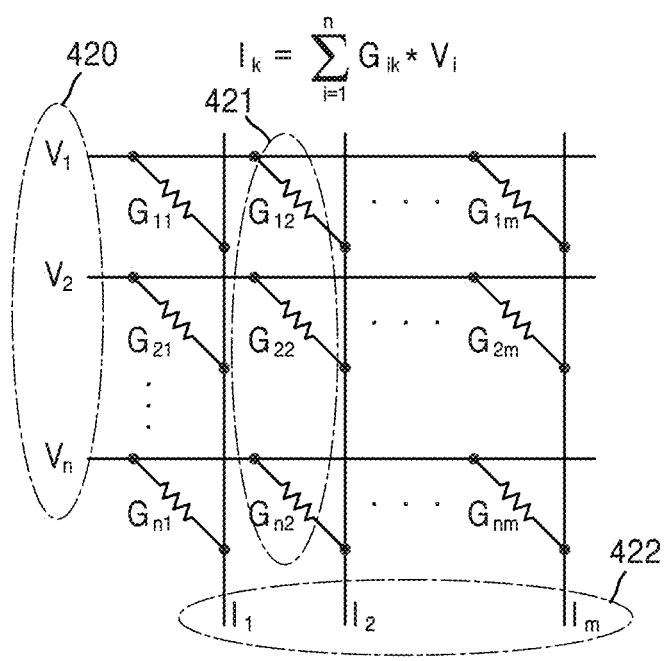
FIGS. 4A and 4B are diagrams for comparing an operation performed in a crossbar array and vector-matrix multiplication according to some example embodiments.

FIGS. 4A and 4B are diagrams for comparing an operation performed in a crossbar array and vector-matrix multiplication according to some example embodiments.

Referring to FIG. 4A, a convolution operation between an input feature map and a weight may be performed using vector-matrix multiplication. For example, pixel data of an input feature map may be expressed as a matrix X 410, and weight values may be expressed as a matrix W 411. Pixel data of an output feature map may be expressed as a matrix Y 412, which may represent a result of multiplication between the matrix X 410 and the matrix W 411.

Referring to FIG. 4B, a vector-matrix multiplication operation may be performed using a nonvolatile memory device of a crossbar array. Comparing with FIG. 4A, the pixel data of the input feature map may be received as an input value of a nonvolatile memory device, wherein the input value may be a voltage 420. Furthermore, the weight values may be stored in synapses of the nonvolatile memory device (e.g., memory cells) and the weight values stored in the memory cells may be a conductance 421 of the synapses. Therefore, an output value of the nonvolatile memory device may be expressed as a current 422 that is a result of interaction between the voltage 420 and the conductance 421.

Figure 5:
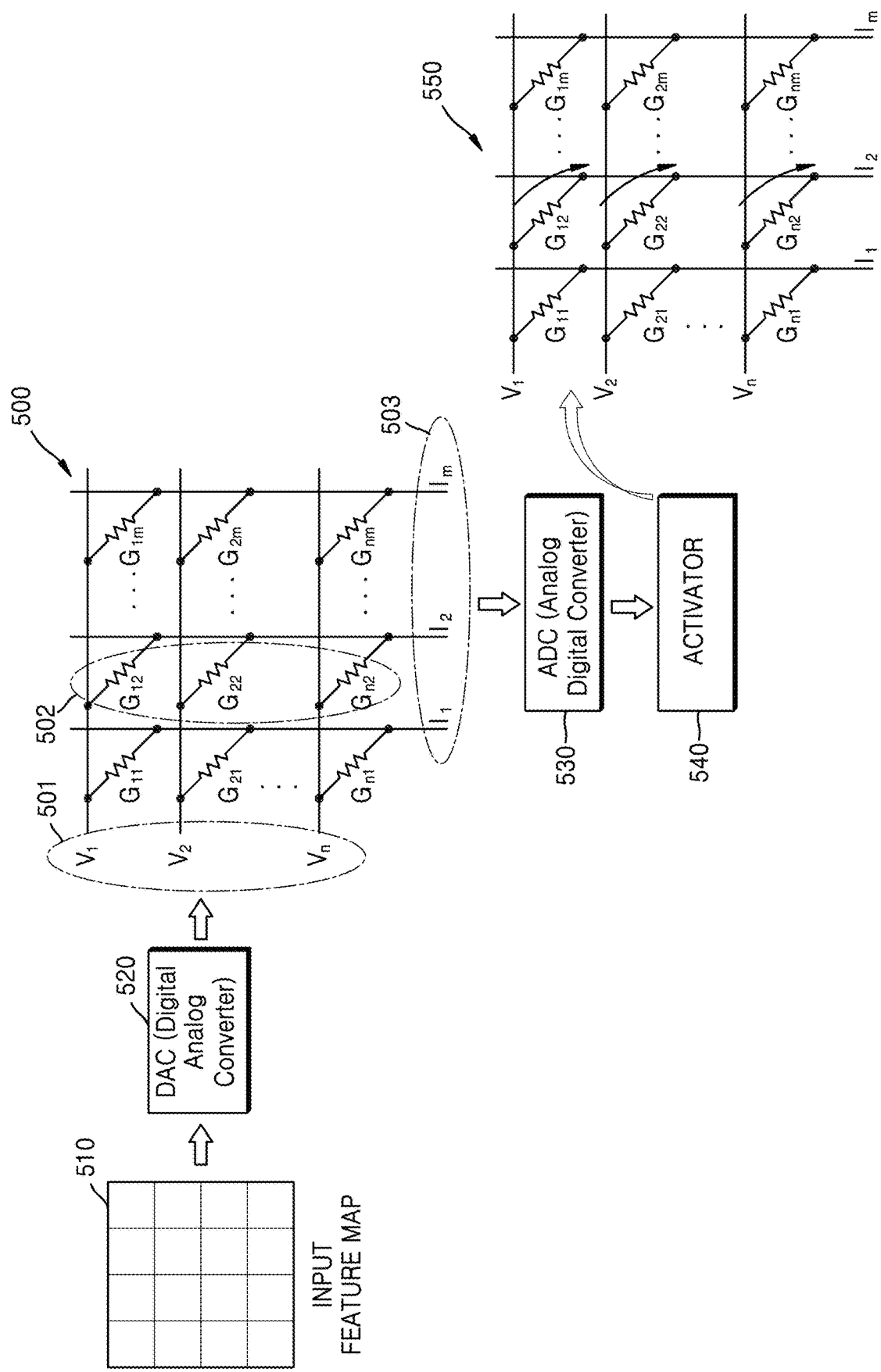
FIG. 5 is a diagram for describing an example of performing a convolution operation in a crossbar array according to some example embodiments.

FIG. 5 is a diagram for describing an example of performing a convolution operation in a crossbar array according to some example embodiments.

A crossbar array 500 may receive pixel data of an input feature map 510. The crossbar array 500 may include a plurality of nonvolatile memory devices.

In some example embodiments, in the case where the crossbar array 500 is an N×M matrix (wherein N and M are natural numbers equal to or greater than 2), the number of pieces of pixel data of the input feature map 510 may be equal to or less than the number of columns M of the crossbar array 500. The pixel data of the input feature map 510 may represent a parameter having a floating point format and/or fixed point format. In other example embodiments, the number of pieces of pixel data of the input feature map 510 may be greater than the number of columns M of the crossbar array 500, and relevant detailed descriptions will be provided with reference to FIG. 6.

A digital-to-analog converter (DAC) 520 may configured to receive digital signal-type pixel data and to convert the pixel data into an analog signal-type voltage. The pixel data of the input feature map 510 may have various bit resolution values such as 1-bit, 4-bit, or 8-bit resolution. In some example embodiments, the crossbar array 500 may be configured to receive a voltage 501 as an input value for the crossbar array 500 after converting the pixel data into a voltage using the DAC 520.

Furthermore, trained weight values may be respectively stored in the plurality of nonvolatile memory devices included in the crossbar array 500. The weight values may be stored in memory cells of the nonvolatile memory devices, wherein the weight values stored in the memory cells may be conductance 502. Here, the crossbar array 500 may calculate an output value by performing multiplication between the voltage 501 and the conductance 502, and the output value may be expressed as a current 503. For example, the crossbar array 500 may output the same result value as a result of a convolution operation between an input feature map and a weight using the plurality of nonvolatile memory devices.

Since the current 503 output from the crossbar array 500 is an analog signal, an analog-to-digital converter (ADC) 530 may be used to convert the current 503 to input data for another crossbar array 550. The current 503 output from the crossbar array 500 may be converted into a digital signal by the ADC 530. In some example embodiments, the current 503 may be converted into a digital signal so as to have the same bit resolution as the pixel data of the input feature map 510 by using the ADC 530. For example, when the pixel data of the input feature map 510 has a 1-bit resolution, the current 503 may be converted into a 1-bit resolution digital signal by the ADC 530.

An activator 540 may apply an activation function to the digital signal achieved through conversion by the ADC 530. The activation function may include a sigmoid function, a tanh function, and/or a rectified linear unit (ReLU) function, but the activation functions that may be applied to a digital signal is not limited thereto.

The digital signal to which the activation function is applied may be used as an input value for another crossbar array 550. When the digital signal to which the activation function is applied is used as an input value for another crossbar array 550, the same process as described above may apply to the other crossbar array 550.

Figure 6:
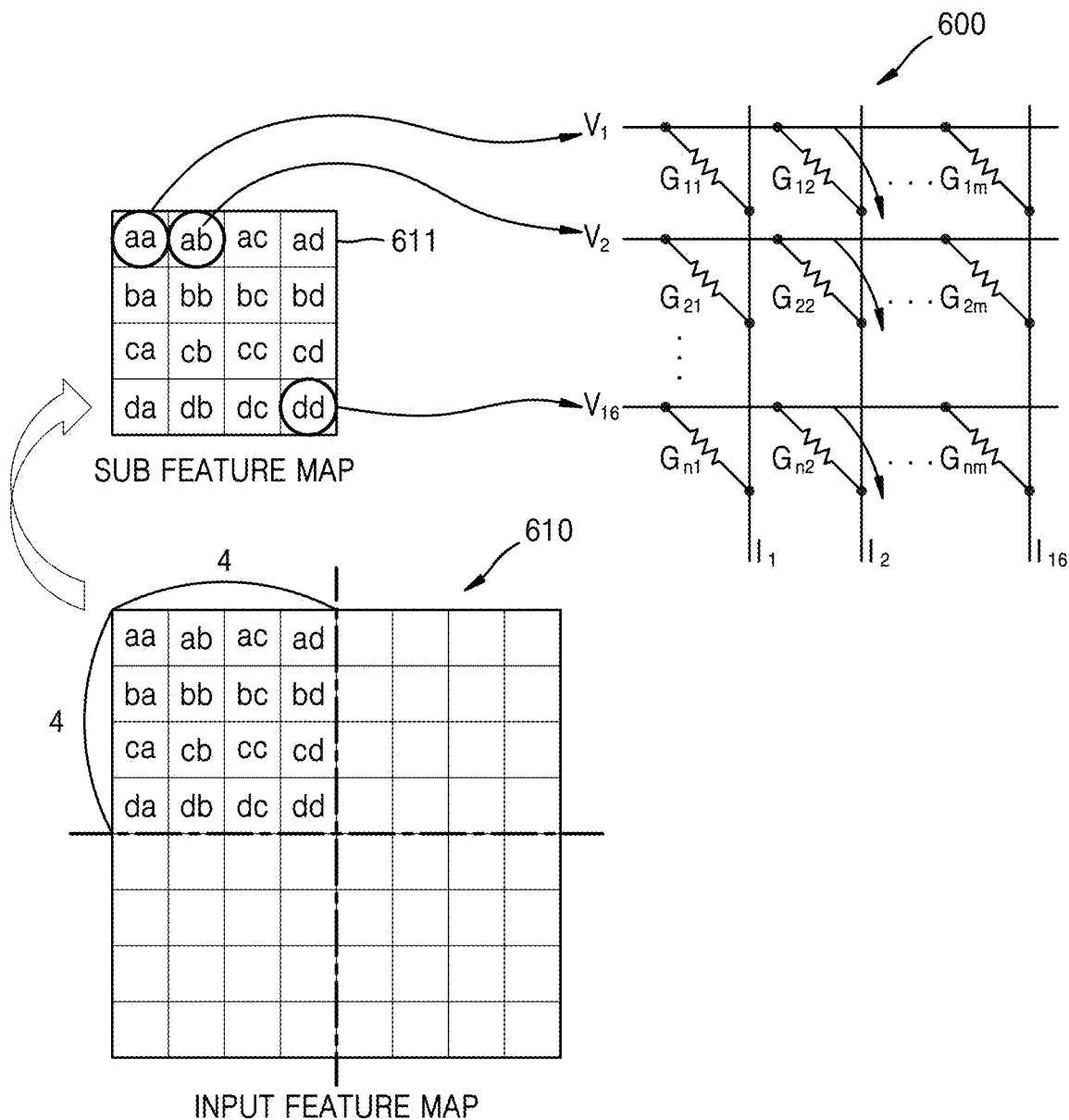
FIG. 6 is a diagram for describing an example of matching between a crossbar array and a sub feature map according to some example embodiments.

FIG. 6 is a diagram for describing an example of matching between a crossbar array and a sub feature map according to some example embodiments.

An input feature map 610 used for training and inference may have various sizes. Here, since the size of a crossbar array 600 is limited, the number of pieces of pixel data of the single input feature map 610 may be greater than the number of input values that the crossbar array 600 may receive.

Referring to FIG. 6, the size of the input feature map 610 is 8×8, and the size of the crossbar array 600 is 16×16. In this case, the number of pieces of pixel data of the 8×8 input feature map 610 is 64 (=8×8) and is thus greater than 16 which is the number of input values that the crossbar array 600 may receive.

When the number of pieces of pixel data of the input feature map 610 is greater than the number of input values of the crossbar array 600 (e.g., the number of rows m) the input feature map 610 may be divided into sub feature maps 611. The input feature map 610 may be divided into the sub feature maps 611 based on size information about the crossbar array 600.

In detail, when the size of the input feature map 610 is 8×8 and the size of the crossbar array 600 is 16×16, the input feature map 610 may be divided into four sub feature maps so that the number of pieces of pixel data of each sub feature map may be 16. Each of the sub feature maps may match the crossbar array 600.

For example, the crossbar array 600 may be configured to receive a piece of pixel data as an input value, for example, to receive 'aa' of the sub feature map 610 as a first input value 'V1', 'ab' of the sub feature map 610 as a second input value 'V2', and 'dd' of the sub feature map 610 as a 16th input value 'V16'.

As described above with reference to FIG. 5, pieces of pixel data of the sub feature map 610 may be a digital signal (for example, 1-bit signal, 4-bit signal, or the like) and may be input to the crossbar array 600 after being converted into analog voltage signals $V_1$ to $V_{16}$ by passing through a DAC.

Furthermore, currents $I_1$ to $I_{16}$ output from the crossbar array 600 may be an analog signal, and may be converted into a digital signal by passing through an ADC.

Figure 7A:
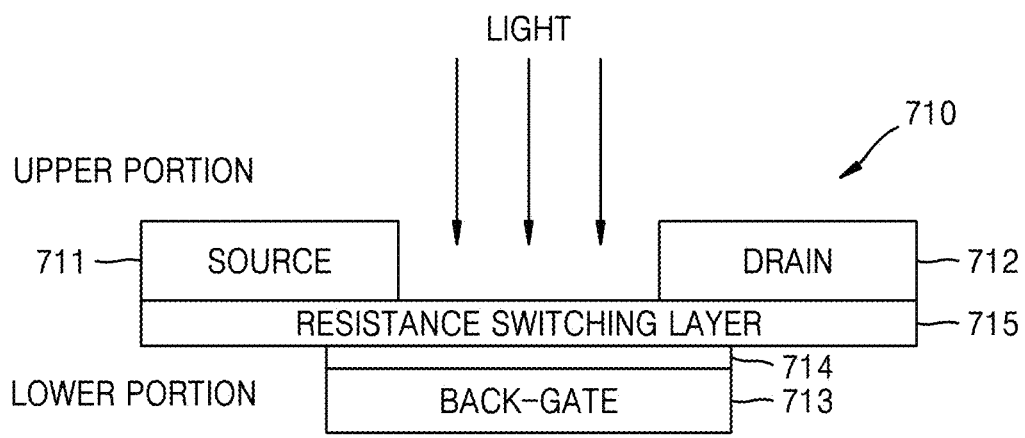
FIGS. 7A and 7B are side views illustrating a nonvolatile memory device having a phototransistor and memory characteristics according to some example embodiments.
Figure 7B:
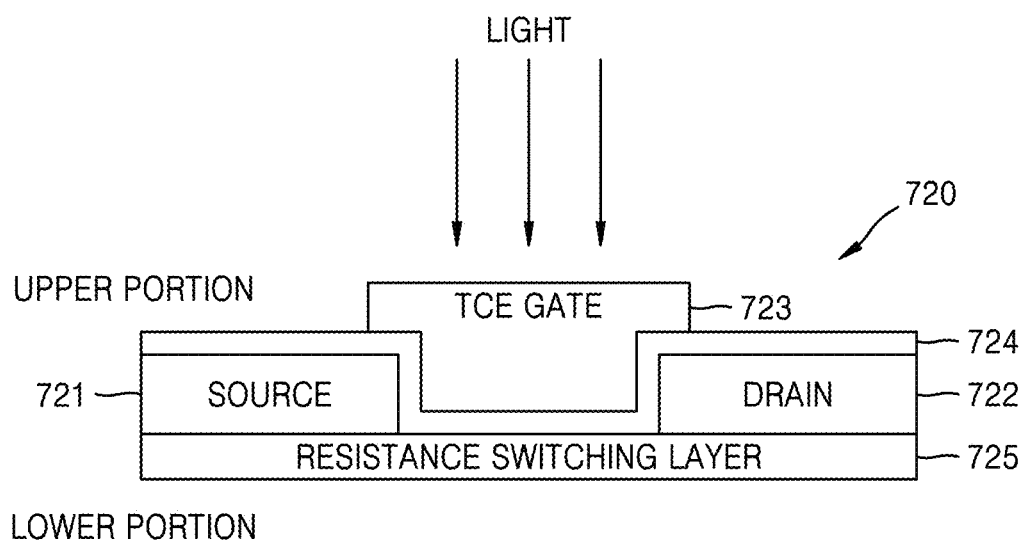

FIGS. 7A and 7B are side views illustrating a nonvolatile memory device having phototransistor and memory characteristics according to some example embodiments.

Nonvolatile memory devices 710 and 720 may include resistance switching layers 715 and 725. Gates 713 and 723 may be on the resistance switching layers 715 and 725 (e.g., above and/or under the resistance switching layers 715 and 725). Gate oxide layers 714 and 724 may be between the resistance switching layers 715 and 725 and the gates 713 and 723. Furthermore, sources 711 and 721 and drains 712 and 722 may be on the resistance switching layers 715 and 725 and may be spaced apart from each other. The nonvolatile memory devices 710 and 720 may include the synapses 30, as described above, with the gates 713 and 723 and the drains 712 and 722 connected to the presynaptic neuron 10 and the postsynaptic neuron 20, respectively.

Figure 8:
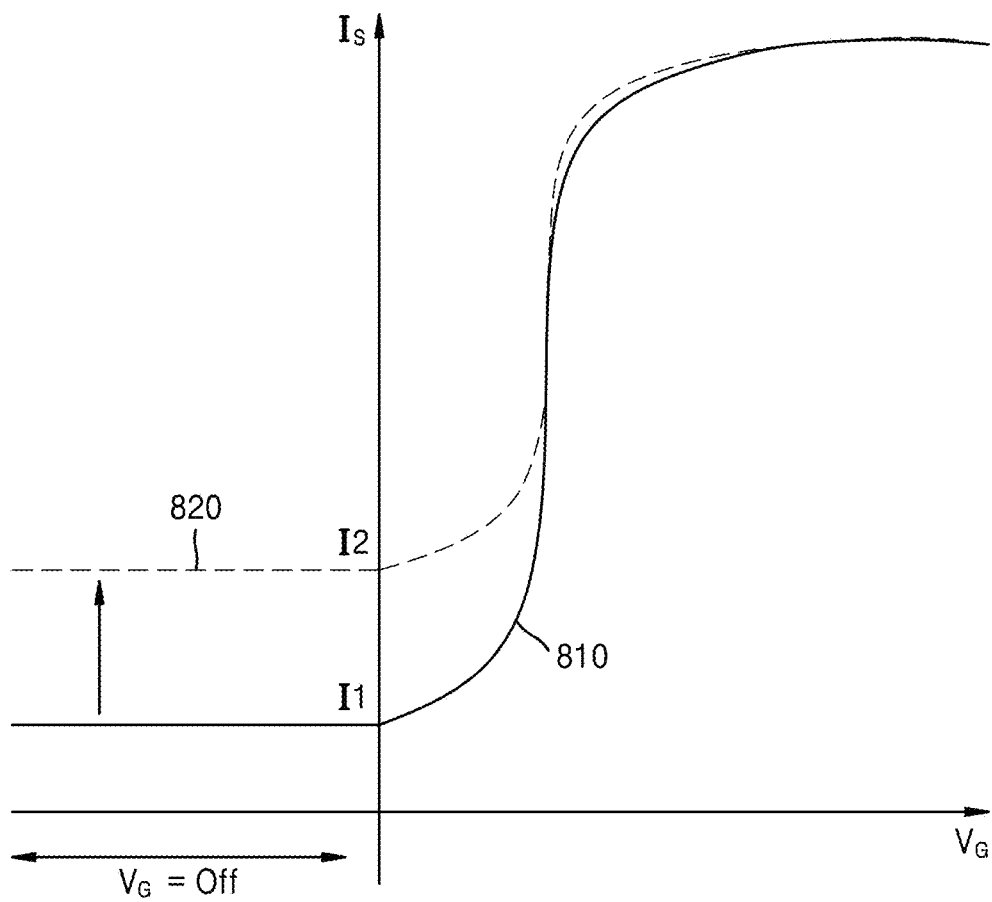
FIG. 8 is a diagram for describing a phenomenon in which a resistance value of a nonvolatile memory device changes before and after light is irradiated to the nonvolatile memory device.

In some example embodiments, an off-voltage is applied to the gates 713 and 723 when light is irradiated to the resistance switching layers 715 and 725, and relevant detailed descriptions will be provided with reference to FIG. 8.

A resistance value of the resistance switching layers 715 and 725 may be changed based on illumination of light irradiated to the resistance switching layers 715 and 725, and may be maintained as a changed resistance value.

For example, since light is irradiated to the resistance switching layers 715 and 725, charges (e.g., electrons and/or holes) may be trapped in an internal defect of the resistance switching layers 715 and 725. For example, the charges generated in the resistance switching layers 715 and 725 by a photoelectric response between the resistance switching layers 715 and 725 to the light. Since the charges are trapped in the internal defects of the resistance switching layers 715 and 725, the resistance value of the resistance switching layers 715 and 725 may be changed, and, thereafter, the resistance value of the resistance switching layers 715 and 725 may be maintained as a changed resistance value even if light is not irradiated to the resistance switching layers 715 and 725.

As the illumination of light irradiated to the resistance switching layers 715 and 725 increases, a reduction rate of the resistance value of the resistance switching layers 715 and 725 may increase. In detail, as the illumination of light irradiated to the resistance switching layers 715 and 725 increases, charges trapped in an internal defect of the resistance switching layers 715 and 725 may increase. When charges trapped in the resistance switching layers 715 and 725 increase, the resistance value of the resistance switching layers 715 and 725 may decrease.

In some example embodiments, the light irradiated to the resistance switching layers 715 and 725 may be light of a visible light region. The resistance switching layers 715 and 725 may include the materials described below so that the resistance value of the resistance switching layers 715 and 725 may change even if light of a visible light region rather than high-energy light such as ultraviolet (UV) light is irradiated to the resistance switching layers 715 and 725.

In some example embodiments, the resistance switching layers 715 and 725 may include a 2-dimension (2D) material. The resistance switching layers 715 and 725 may include a single-layer 2D material or multi-layer 2D material. For example, the resistance switching layers 715 and 725 may include at least one of a transition metal dichalcogenide (TMD), phosphorene (black phosphorus), silicene, and/or graphene. The TMD, for example, may include at least one of $MoS_2$, $MoSe_2$, $MoTe_2$, $WS_2$, $WSe_2$, $WTe_2$, $TaS_2$, $TaSe_2$, $TiS_2$, $TiSe_2$, $ZrS_2$, $ZrSe_2$, $HfS_2$, $HfSe_2$, $SnS_2$, $SnSe_2$, $GeS_2$, $GeSe_2$, $GaS_2$, $GaSe_2$, $GaSe$, $GaTe$, $InSe$, $In_2Se_3$, $Bi_2S_3$, $Bi_2Se_3Bi_2Te_3$, and/or a combination there.

In other example embodiments, the resistance switching layers 715 and 725 may include a 3-dimension (3D) material. For example, the resistance switching layers 715 and 725 may include at least one of germanane, silicon, group III-V semiconductors, an indium based semiconductor such as Indium gallium zinc oxide (IGZO), and/or a combination thereof.

In some example embodiments, the gate oxide layers 714 and 724 may be formed as a single layer. For example, the gate oxide layers 714 and 724 may be formed as a single-layer aluminum oxide.

In other example embodiments, the gate oxide layers 714 and 724 may be formed as a multi-layer. The gate oxide layers 714 and 724 may include a charge trapping layer. For example, the gate oxide layers 714 and 724 may have a structure in which a charge trapping layer is between two aluminum oxide layers. The charge trapping layer may include at least one of hafnium oxide and/or silicon nitride, but is not limited thereto.

FIG. 7A illustrates the nonvolatile memory device 710 using the back-gate 713. The back-gate 713 may be under the resistance switching layer 715. For example, the back-gate 713 may be implemented using an appropriate technology such as silicon on insulator (SOI) substrate technology.

The gate oxide layer 714 may be arranged under the resistance switching layer 715 and between the resistance switching layer 715 and the back-gate 713.

FIG. 7B illustrates the nonvolatile memory device 720 using a transparent conducting electrode (TCE) gate 723. The TCE gate 723 may be arranged above the resistance switching layer 725. In FIGS. 7A and 7B, "above" and "under" may refer to the position of the gate relative to a potential source of light.

Since light is irradiated to the resistance switching layer 725 from above the resistance switching layer 725, the light arrives at the TCE gate 723 before reaching the resistance switching layer 725. Since the TCE gate 723 capable of transmitting light is used in the nonvolatile memory device 720, light may arrive at the resistance switching layer 725 from above the resistance switching layer 725.

The gate oxide layer 724 may be arranged above the resistance switching layer 725 and between the resistance switching layer 725 and the TCE gate 723.

FIG. 8 is a diagram for describing a phenomenon in which a resistance value of a nonvolatile memory device changes before and after light is irradiated to the nonvolatile memory device.

The nonvolatile memory device may include a resistance switching layer. A gate may be arranged above and/or under the resistance switching layer. A gate oxide layer may be between the resistance switching layer and the gate. Furthermore, a source and a drain may be formed on the resistance switching layer and may be spaced apart from each other.

When an off-voltage is applied to the gate of the nonvolatile memory device, the nonvolatile memory device may operate as a device having phototransistor and memory characteristics. Hereinafter, it is assumed that the nonvolatile memory device is an N-type metal-oxide-semiconductor (NMOS) device, but it would be obvious to those of ordinary skill in the art that the nonvolatile memory device may be implemented as various types of field effect transistors (FETs), for example a variable resistance FET.

A first graph 810 indicates a current $I_S$ detected from the source of the nonvolatile memory device according to a gate voltage $V_G$ before light is irradiated to the nonvolatile memory device.

A second graph 820 indicates the current $I_S$ detected from the source of the nonvolatile memory device according to the gate voltage $V_G$ after light is irradiated to the nonvolatile memory device.

With regard to the first graph 810 and the second graph 820, a voltage $V_D$ is applied to the drain of the nonvolatile memory device.

Since charges are trapped in an internal defect of the resistance switching layer of the nonvolatile memory device, the current $I_S$ having a constant value may be detected from the source even when the gate voltage $V_G$ of the nonvolatile memory device is an off-voltage.

The resistance value of the resistance switching layer may be reduced since more charges are trapped in the defect when light is irradiated to the resistance switching layer of the nonvolatile memory device. Thereafter, the resistance value of the resistance switching layer may be maintained as a reduced value even if light is not irradiated to the resistance switching layer.

Referring to the first graph 810, the current detected from the source is $I_1$ when an off-voltage is applied to the gate of the nonvolatile memory device.

Referring to the second graph 820 indicating the current detected from the source of the nonvolatile memory device after light is irradiated to the nonvolatile memory device, the current detected from the source may increase from $I_1$ to $I_2$ when an off-voltage is applied to the gate of the nonvolatile memory device. The resistance value of the resistance switching layer reduces since light is irradiated to the resistance switching layer of the nonvolatile memory device, and, accordingly, the current detected from the source of the nonvolatile memory device may increase. Thereafter, the resistance value of the resistance switching layer may be maintained as a changed value even if light is not irradiated to the resistance switching layer of the nonvolatile memory device, and the current detected from the source may also be maintained as $I_2$ when an off-voltage is applied to the gate of the nonvolatile memory device.

In some example embodiments, as the illumination of light irradiated to the resistance switching layer of the nonvolatile memory device increases, charges trapped in the resistance switching layer may increase, and thus the resistance value of the resistance switching layer may be reduced. As a result, the current detected from the source of the nonvolatile memory device may increase above $I_2$.

Furthermore, when an on-voltage that is equal to or greater than a threshold is applied to the gate of the nonvolatile memory device, the resistance value of the resistance switching layer of the nonvolatile memory device may be reset. For example, a voltage of 7 V may be applied to the gate for 10 seconds to reset the resistance value of the resistance switching layer.

When the source current has increased from $I_1$ to $I_2$ at an off-voltage of the gate since light is irradiated to the resistance switching layer of the nonvolatile memory device, the source current may decrease from $I_2$ back to $I_1$ when an on-voltage that is equal to or greater than a threshold is applied to the gate of the nonvolatile memory device.

Figure 9A:
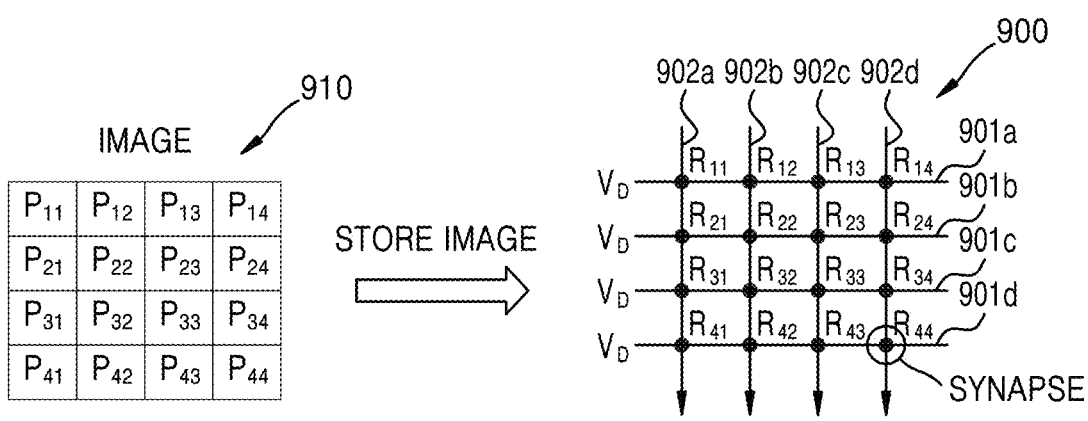
FIGS. 9A and 9B are diagrams for describing a process of storing an image and obtaining a stored image using a crossbar array including a plurality of nonvolatile memory devices according to some example embodiments.
Figure 9B:
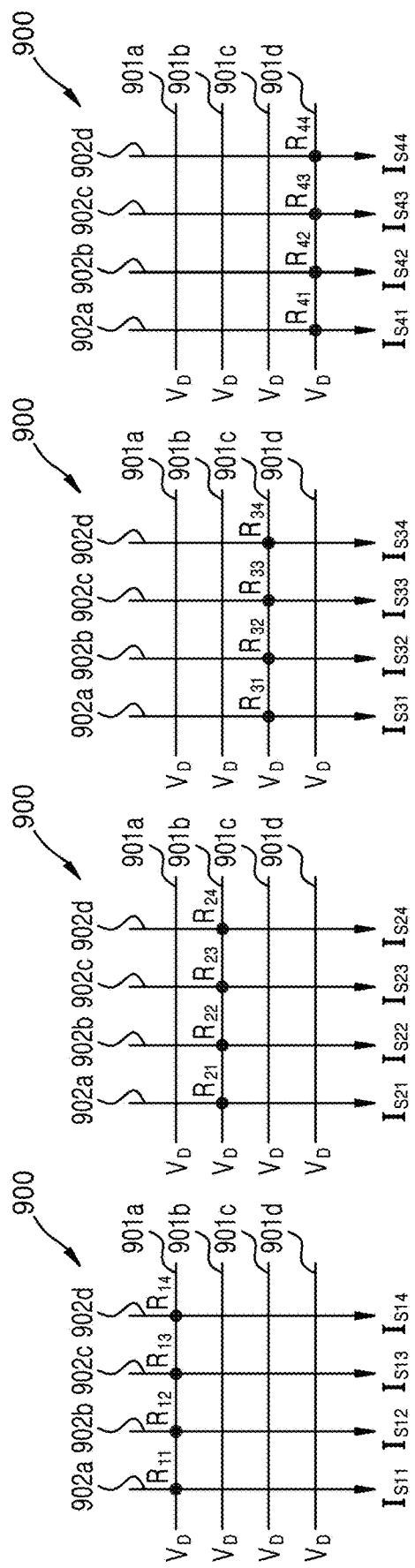

FIGS. 9A and 9B are diagrams for describing a process of storing an image and obtaining a stored image using a crossbar array including a plurality of nonvolatile memory devices according to some example embodiments.

Although FIGS. 9A and 9B illustrate that an image 910 has a 4×4 size, and a crossbar array 900 has a 4×4 size, those of ordinary skill in the art could understand that the size of the image 910 and the size of the crossbar array 900 may be variously modified.

The crossbar array 900 may include a plurality of nonvolatile memory devices. In FIGS. 9A and 9B, the nonvolatile memory device is expressed as a location (a, b) in which a row and column of the crossbar array 900 intersect.

Referring to FIG. 9A, an image may be stored using the crossbar array 900 including the plurality of nonvolatile memory devices.

An off-voltage may be applied to the gate of the plurality of nonvolatile memory devices and a drain voltage $V_D$ may be applied to the drain of the plurality of nonvolatile memory devices to store an image using the crossbar array 900.

Light having illumination corresponding to an image may be irradiated to each of the plurality of nonvolatile memory devices to change the resistance value of the resistance switching layer of each of the plurality of nonvolatile memory devices.

Light corresponding to each of a plurality of pixels $P_{11}$ to $P_{14}$, $P_{21}$ to $P_{24}$, $P_{31}$ to $P_{34}$, and $P_{41}$ to $P_{44}$ included in the image 910 may be irradiated to the plurality of nonvolatile memory devices. For example, light having illumination corresponding to the pixel $P_{11}$ of the image 910 may be irradiated to a nonvolatile memory device (1, 1), light having illumination corresponding to the pixel $P_{21}$ of the image 910 may be irradiated to a nonvolatile memory device (2, 1), light having illumination corresponding to the pixel $P_{32}$ of the image 910 may be irradiated to a nonvolatile memory device (3, 2), and/or light having illumination corresponding to the pixel $P_{44}$ of the image 910 may be irradiated to a nonvolatile memory device (4, 4).

The brightness of each of the plurality of pixels included in the image 910 may be different from each other, and, thus, the illumination of the light irradiated to each of the plurality of nonvolatile memory devices may be different from each other. As a result, variations of the resistance value of the resistance switching layer of each of the plurality of nonvolatile memory devices may be different from each other. The resistance value of the resistance switching layer may be maintained as a changed value even if the light is not being irradiated to the plurality of nonvolatile memory devices.

For example, even if light is not irradiated any more after the resistance value of each of the plurality of nonvolatile memory devices is changed according to the brightness of each of the plurality of pixels included in the image 910, the resistance value of each of the plurality of nonvolatile memory devices is maintained as a changed value, and, thus, the image 910 may be stored in the crossbar array 900.

Furthermore, $R_{11}$ to $R_{14}$, $R_{21}$ to $R_{24}$, $R_{31}$ to $R_{34}$, and $R_{41}$ to $R_{44}$ shown on the crossbar array 900 represent the resistance value of each of the plurality of nonvolatile memory devices.

Referring to FIG. 9B, a stored image may be obtained using the crossbar array 900 including the plurality of nonvolatile memory devices.

A gate off-voltage may be applied to each row of the crossbar array 900 to obtain an image stored in the crossbar array 900. In the crossbar array 900 illustrated in FIG. 9B, a nonvolatile memory device to which the gate off-voltage is applied is marked with a circle.

For example, the gate off-voltage may be applied to a first row 901a of the crossbar array 900 to obtain the pixels $P_{11}$ to $P_{14}$ included in a first row of the image 910. The gate on-voltage may be, subsequently, applied to the second to fourth rows 901b to 901d.

Each of source currents $I_{S11}$ to $I_{S14}$ obtained from each column of the crossbar array 900 may be determined according to resistance values $R_{11}$ to $R_{14}$ of nonvolatile memory devices (1, 1) to (1, 4). The resistance values $R_{11}$ to $R_{14}$ of the nonvolatile memory devices are determined according to the illumination of light corresponding to the pixels $P_{11}$ to $P_{14}$ included in the first row of the image 910. Therefore, the pixels $P_{11}$ to $P_{14}$ included in the first row of the image 910 may be obtained using the source currents $I_{S11}$ to $I_{S14}$ obtained from each column of the crossbar array 900.

Likewise, pixels included in second to fourth rows of the image 910 may be sequentially obtained by applying the gate off-voltage to each of second to fourth rows 901b to 901d of the crossbar array 900 and applying the gate on-voltage to remaining rows.

In some example embodiments, color filters may be sequentially arranged on the crossbar array 900 to obtain a color image from the crossbar array 900.

For example, a color image may be obtained from the crossbar array 900 using three color filters including red, green, and/or blue color filters.

For example, after arranging a red color filter on the crossbar array 900, light having illumination corresponding to each of a plurality of pixels included in a color image may be irradiated to each of a plurality of nonvolatile memory devices. A red image may be obtained by applying the gate off-voltage to each row of the crossbar array 900 and obtaining the source current from each column of the crossbar array 900.

A green image and a blue image may be obtained by repeating the above-described operation using a green color filter and a blue color filter after resetting the crossbar array 900 by applying the gate on-voltage thereto. After the red image, the green image, and the blue image are obtained, a color image may be finally obtained by synthesizing the three images.

The crossbar array 900 including the plurality of nonvolatile memory devices according to the present disclosure may have photoconductivity (PC) characteristics and thus may be used in an imaging mode (image storing/acquisition) due to the characteristics.

Figure 10:
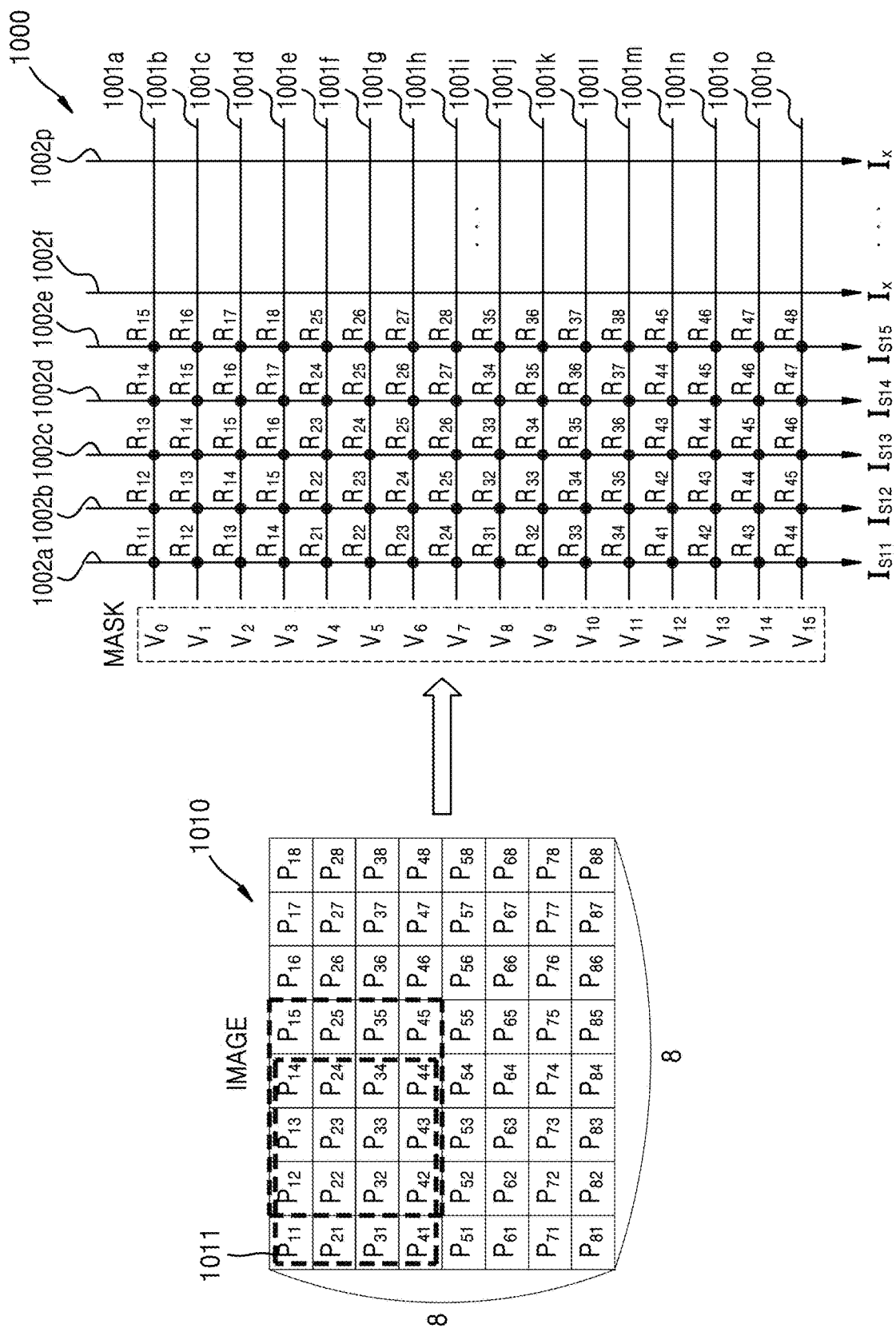
FIG. 10 is a diagram for describing a process of performing a pooling operation of a neural network using a crossbar array including a plurality of nonvolatile memory devices according to some example embodiments.

FIG. 10 is a diagram for describing a process of performing a pooling operation of a neural network using a crossbar array including a plurality of nonvolatile memory devices according to some example embodiments.

Although FIG. 10 illustrate that an image 1010 has a 8×8 size, and a crossbar array 1000 has a 16×16 size, those of ordinary skill in the art could understand that the size of the image 1010 and the size of the crossbar array 1000 may be variously modified. For example, the image 1010 may be an image representing either the number '1' or '9', but is not limited thereto.

In some example embodiments, a window 1011 may be shifted by a stride on the image 1010. The stride may be, for example, predetermined. A size of the window 1011 may be determined based on the size of the crossbar array 1000. In some example embodiments, the size of the window 1011 may be determined based on the number of rows of the crossbar array 1000. For example, in the case where the number of rows of the crossbar array 1000 is 16, the size of the window 1011 may be 4×4.

Hereinafter, the window 1011 is shifted by '1 stride', and the size of the window 1011 is 4×4, but those of ordinary skill in the art could understand that shift and size of the window 1011 may be variously modified.

A plurality of pixels may be included in the window 1011 in each location on the image 1010. For example, in a first location, the window 1011 may include pixels $P_{11}$ to $P_{14}$, $P_{21}$ to $P_{24}$, $P_{31}$ to $P_{34}$, and $P_{41}$ to $P_{44}$. Furthermore, the window 1011 may include pixels $P_{12}$ to $P_{15}$, $P_{22}$ to $P_{25}$, $P_{32}$ to $P_{35}$, and $P_{42}$ to $P_{45}$ in a location shifted by 1 stride from the first location.

Light having illumination corresponding to the plurality of pixels included in the window 1011 may be irradiated to each column of the crossbar array 1000. For example, light having illumination corresponding to the plurality of pixels $P_{11}$ to $P_{14}$, $P_{21}$ to $P_{24}$, $P_{31}$ to $P_{34}$, and $P_{41}$ to $P_{44}$ included in the window 1011 at the first location may be irradiated to a first column 1002a of the crossbar array 1000. That is, light having illumination corresponding to each of 16 pixels included in the window 1011 at the first location may be irradiated to 16 nonvolatile memory devices included in the first column 1002a.

Likewise, light having illumination corresponding to a plurality of pixels included in the window 1011 at an nth location may be irradiated to an nth column of the crossbar array 1000.

A gate off-voltage may be applied to the first to 16th rows 1001a to 1001p of the crossbar array 1000. Furthermore, drain voltages $V_0$ to $V_{15}$ may be applied to the first to 16th rows 1001a to 1001p of the crossbar array 1000. The drain voltages $V_0$ to $V_{15}$ may be set as a mask used for the pooling operation.

The pooling operation may be performed by obtaining a source current from each column of the crossbar array 1000. For example, a first-first source current $I_{S11}$ obtained from the first column 1002a may be a result of pooling performed on the plurality of pixels $P_{11}$ to $P_{14}$, $P_{21}$ to $P_{24}$, $P_{31}$ to $P_{34}$, and $P_{41}$ to $P_{44}$ included in the window 1011 at the first location.

Likewise, first-second source current to first-fifth source current $I_{S12}$ to $I_{S15}$ obtained from second to fifth columns 1002b to 1002e may be results of pooling performed on the window 1011 at second to fifth locations.

Furthermore, since the window 1011 may be positioned at 25 locations on the image 1010, a pooling operation of a neural network may be completed by obtaining results of pooling performed on the plurality of pixels included in the window 1011 at first to 25th locations through the above-described method.

The crossbar array 1000 including the plurality of nonvolatile memory devices according to the present disclosure may perform a vector-matrix operation (e.g., pooling operation), and the crossbar array 1000 may be used for in-memory computing by using this characteristic.

Figure 11:
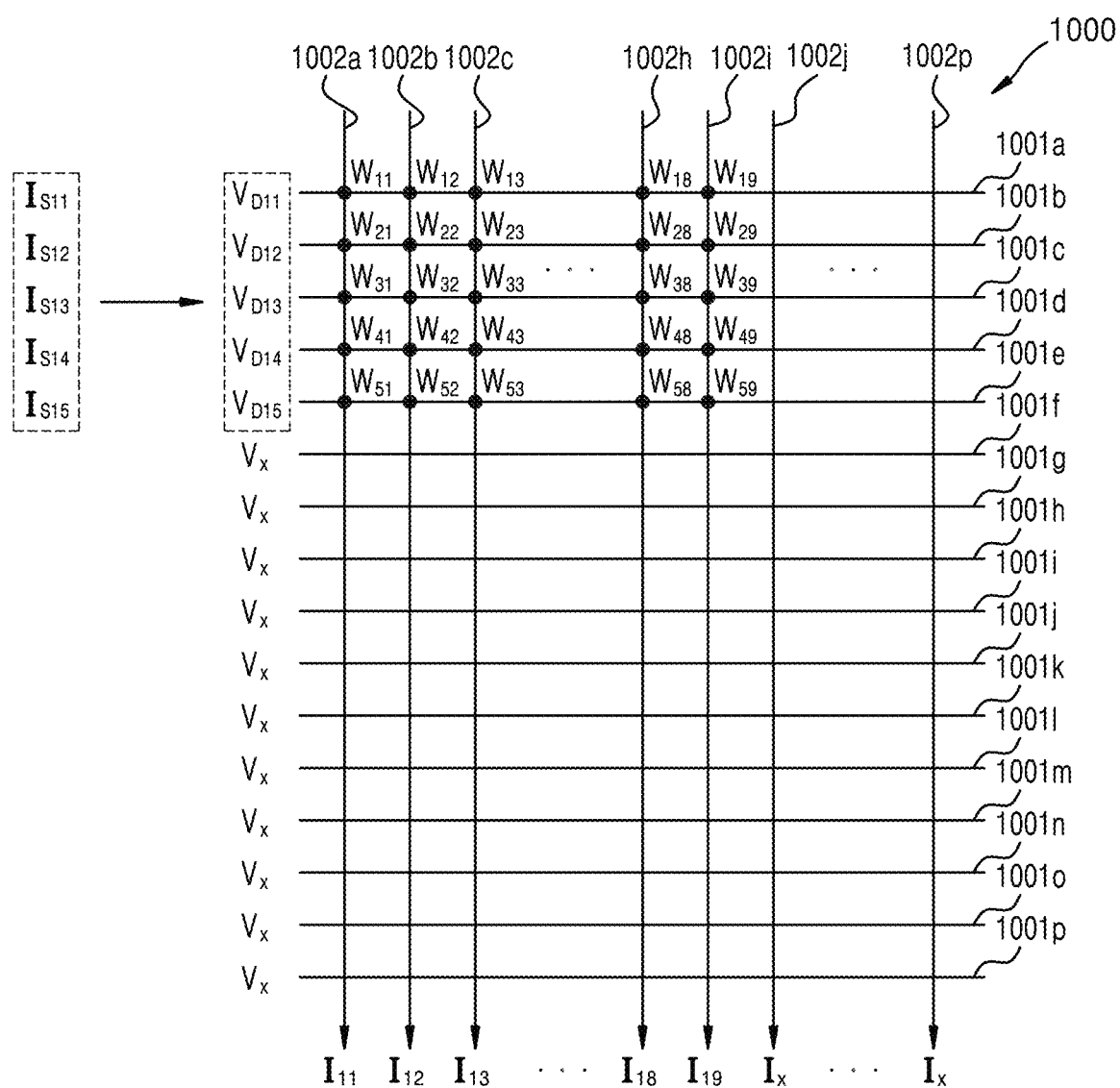
FIG. 11 is a diagram for describing a process of performing a convolution operation of a neural network using a crossbar array including a plurality of nonvolatile memory devices according to some example embodiments.

FIG. 11 is a diagram for describing a process of performing a convolution operation of a neural network using a crossbar array including a plurality of nonvolatile memory devices according to some example embodiments.

The crossbar array 1000 may store a plurality of weights included in a specific layer of a neural network. A plurality of weights may be stored in the crossbar array 1000 by irradiating light having illumination corresponding to each of the plurality of weights included in a specific layer to each of the plurality of nonvolatile memory devices of the crossbar array 1000. A specific method of this operation is described above with reference to FIG. 9A and is thus omitted here.

In some example embodiments, a fully-connected convolution operation may be performed using the crossbar array 1000. In FIG. 11, a fully-connected convolution operation for recognizing the image 1010 of FIG. 10 is performed. For example, the fully-connected convolution operation may be performed using the crossbar array 1000 to determine which number among numbers 1 to 9 the image 1010 corresponds to.

The crossbar array 1000 may be reset to perform the fully-connected convolution operation.

A drain voltage of the crossbar array 1000 may correspond to an input value for a fully-connected layer. The first-first source current to first-fifth source current $I_{S11}$ to $I_{S15}$ obtained from the crossbar array 1000 and corresponding to the window 1011 at the first to fifth locations may correspond to an input value for a fully-connected layer.

For example, the first-first source current to first-fifth source current $I_{S11}$ to $I_{S15}$ may be converted into first to fifth drain voltages $V_{D11}$ to $V_{D15}$. Furthermore, the first to fifth drain voltages $V_{D11}$ to $V_{D15}$ may be respectively applied to the first to fifth rows 1001a to 1001e.

The image 1010 may be recognized by obtaining a source current from each column of the crossbar array 1000. For example, a second-first source current $I_{11}$ may be obtained from the first column 1002a indicates a probability that the image 1010 will correspond to the number '1'. Furthermore, second-second source current to second-ninth source current $I_{12}$ to $I_{19}$ may be obtained from the second to ninth columns 1002b to 1002i respectively indicate probabilities that the image 1010 will correspond to the numbers '2' to '9'.

The window 1011 may be positioned at 25 locations on the image 1010, and the second-first source current to second-ninth source current $I_{11}$ to $I_{19}$ obtained from the crossbar array 1000 are merely results of fully-connected operations performed on the window 1011 at the first to fifth locations. That is, the image 1010 may be finally recognized by obtaining results of fully-connected operations performed on the window 1011 at remaining locations on the image 1010.

The above-described process may be repeated to obtain, from the crossbar array 1000, the second-first source current to second-ninth source current $I_{11}$ to $I_{19}$ for the first to ninth columns 1002a to 1002i based on 25 source currents corresponding to the window 1011 at the first to 25th locations.

The second-first source current to second-ninth source current $I_{11}$ to $I_{19}$ obtained from the first to ninth columns 1002a to 1002i of the crossbar array 1000 may indicate probabilities that the image 1010 will correspond to the numbers '1' to '9'. The image 1010 may be finally recognized as a number having a highest probability value among the numbers '1' to '9'. For example, when a value of the second-first source current $I_{11}$ is greatest, the image 1010 may be finally recognized as the number '1'.

The plurality of weights stored in a specific layer of the neural network may be updated as training of the neural network progresses. When the weights are updated, the updated weights may be stored in the crossbar array 1000 by irradiating light having illumination corresponding to each of the updated weights to each of the plurality of nonvolatile memory devices after resetting the crossbar array 1000. The crossbar array 1000 may be widely used for training and inference processes of a neural network.

The crossbar array 1000 including the plurality of nonvolatile memory devices according to the present disclosure may perform a vector-matrix operation, and the crossbar array 1000 may be used for training and inference processes for image recognition by using this characteristic.

In some example embodiments, a crossbar array used in an imaging mode (image storing/acquisition) may be used in a recognition mode (neural network training/inference) after being reset. Therefore, a single crossbar array may be used both in the imaging mode and in the recognition mode.

Figure 12:
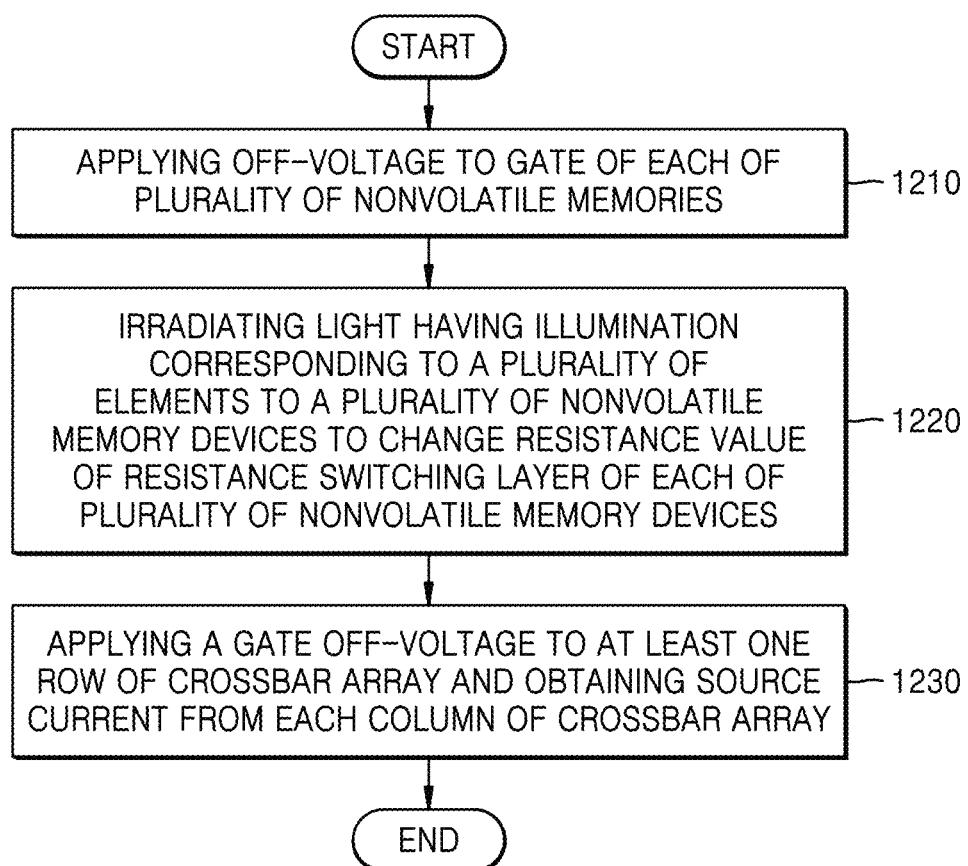
FIG. 12 is a flowchart of a method of performing a predetermined operation using a crossbar array according to some example embodiments.

FIG. 12 is a flowchart for describing a method of performing a predetermined operation using a crossbar array according to some example embodiments. The method of performing a predetermined operation, illustrated in FIG. 12, is related to the embodiments described above with reference to the above-mentioned drawings. Thus, although omitted below, the descriptions provided above with reference to the above-mentioned drawings may apply to the method of FIG. 12.

The crossbar array described below may include a plurality of nonvolatile memory devices. The nonvolatile memory device may include a resistance switching layer. A gate may be arranged above or under the resistance switching layer. A gate oxide layer may be formed between the resistance switching layer and the gate. Furthermore, a source and a drain may be formed on the resistance switching layer and may be spaced apart from each other.

Referring to FIG. 12, an off-voltage may be applied to a gate of each of the plurality of nonvolatile memory devices in operation 1210.

When the off-voltage is applied to the gate of the nonvolatile memory device, the nonvolatile memory device may operate as a device having phototransistor and memory characteristics. The gate off-voltage may be −6 V but is not limited thereto.

Furthermore, when an on-voltage is applied to the gate of the nonvolatile memory device, the nonvolatile memory device may be reset.

In operation 1220, light having illumination corresponding to each of a plurality of elements may be irradiated to each of the plurality of nonvolatile memory devices to change the resistance value of the resistance switching layer of each of the plurality of nonvolatile memory devices.

The resistance value of the resistance switching layer may be changed based on the illumination of light irradiated to the resistance switching layer, and may be maintained as a changed resistance value. In detail, since charges are trapped in an internal defect of the resistance switching layer when light is irradiated to the resistance switching layer, the resistance value of the resistance switching layer may be changed, and, thereafter, the resistance value of the resistance switching layer may be maintained as a changed resistance value even if light is not irradiated to the resistance switching layer.

As the illumination of light irradiated to the resistance switching layer increases, a reduction rate of the resistance value of the resistance switching layer may increase. As the illumination of light irradiated to the resistance switching layer increases, charges trapped in internal defects of the resistance switching layer may increase. When charges trapped in the resistance switching layer increase, the resistance value of the resistance switching layer may decrease.

As noted above, in some example embodiments, the resistance switching layer may include a 2D material. For example, the resistance switching layer may include at least one selected from the group consisting of transition metal dichalcogenide (TMD), silicene, phosphorene (black phosphorus), and graphene.

Furthermore, the resistance switching layer may include a 3D material. For example, the resistance switching layer may include at least one selected from the group consisting of germanane, silicon, groups III-V semiconductors, and/or IGZO.

In operation 1230, a gate off-voltage may be applied to at least one row of the crossbar array and obtaining a source current from each column of the crossbar array.

In some example embodiments, a processor 1310 may be configured to operate and/or control the method of performing a predetermined operation using a crossbar array, described above. The processor 1310 may further be configured obtain an image using the crossbar array. In this case, the plurality of elements may be a plurality of pixels included in the image.

Light having illumination corresponding to each of the plurality of pixels included in the image may be irradiated to each of the plurality of nonvolatile memory devices. The processor 1310 may obtain the image by applying the gate off-voltage to each row of the crossbar array and obtaining the source current from each column of the crossbar array.

Furthermore, color filters may be sequentially arranged on the crossbar array to obtain a color image from the crossbar array.

In some example embodiments, the processor 1310 may perform an operation of a neural network using the crossbar array. In this case, the plurality of elements may be a plurality of weights included in a specific layer of the neural network.

Light having illumination corresponding to each of the plurality of weights included in a specific layer of the neural network may be irradiated to each of the plurality of nonvolatile memory devices. The processor 1310 may perform an operation of the neural network by applying a gate off-voltage to at least one row of the crossbar array and obtaining a source current from each column of the crossbar array. For example, the operation of the neural network may include a pooling operation, a convolution operation, and a full-connected convolution operation, but is not limited thereto.

In the present disclosure, an image may be stored using the crossbar array, or a stored image may be obtained from the crossbar array. Furthermore, in the present disclosure, an image may be recognized by performing an operation of a neural network using the crossbar array.

Figure 13:
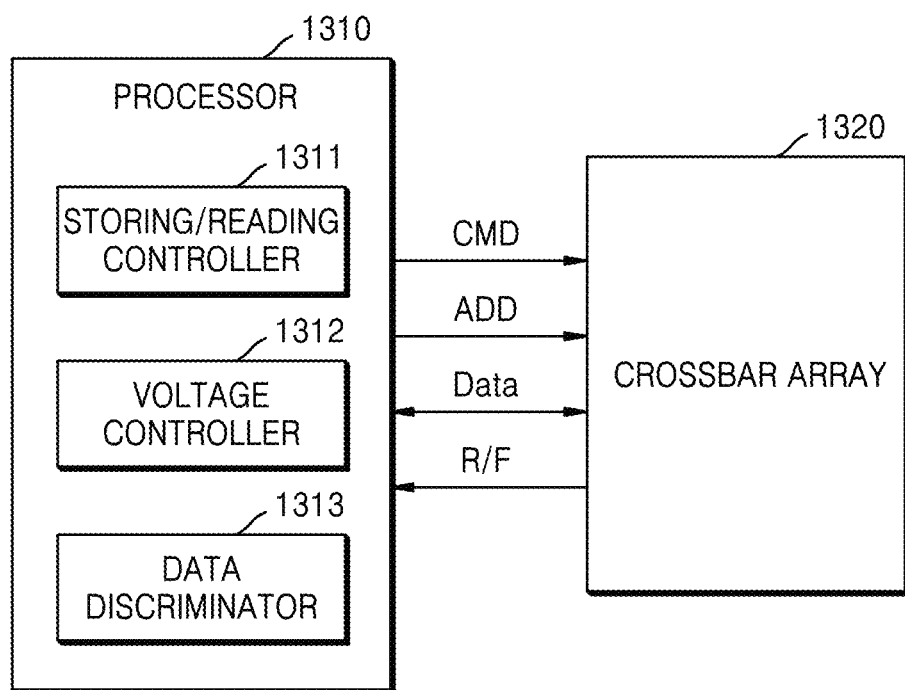
FIG. 13 is a block diagram illustrating a memory system according to some example embodiments.

FIG. 13 is a block diagram illustrating a memory system according to some example embodiments.

Referring to FIG. 13, a memory system 1300 may include a processor 1310 and at least one crossbar array 1320. The processor 1310 may perform a control operation on the crossbar array 1320 and, for example, may provide an address ADD and a command CMD to the crossbar array 1320 to perform data storing, reading, and erasing operations on the crossbar array 1320. Furthermore, data to be stored or read may be transmitted/received between the processor 1310 and the crossbar array 1320.

The crossbar array 1321 may include a plurality of nonvolatile memory devices arranged in regions in which a plurality of rows and a plurality of columns intersect. In some example embodiments, the nonvolatile memory device may include a resistance switching layer. A gate may be above and/or under the resistance switching layer. A gate oxide layer may be between the resistance switching layer and the gate. Furthermore, a source and a drain may be on the resistance switching layer and may be spaced apart from each other.

The processor 1310 may include a storing/reading controller 1311, a voltage controller 1312, and a data discriminator 1313. However, the above-mentioned elements included in the processor 1310 are merely examples, and it would be obvious to those of ordinary skill in the art that some elements may be excluded or other elements may be further included.

The storing/reading controller 1311 may be configured to generate the address ADD and the command CMD for performing data storing, reading, and erasing operations on the crossbar array 1321. The voltage controller 1312 may be configured to generate a voltage control signal for controlling at least one voltage level used in the crossbar array 1320. For example, the voltage controller 1312 may generate a voltage control signal for controlling a level of a voltage applied to a row of the crossbar array 1321 to read data from the crossbar array 1321 or store data in the crossbar array 1321.

The data discriminator 1313 may be configured to discriminate data read from the crossbar array 1320. For example, the data discriminator 1313 may discriminate data read from the crossbar array 1321 to determine whether each of the plurality of nonvolatile memory devices included in the crossbar array 1321 is in an on state or off state. For example, once data is stored in the crossbar array 1321, the data discriminator 1313 may discriminate a state of data of the plurality of nonvolatile memory devices included in the crossbar array 1321 using a reading voltage to determine whether the data has been stored normally in the nonvolatile memory devices.

The processor 1310, and/or the included storing/reading controller 1311, voltage controller 1312, and data discriminator 1313. may include, for example, processing circuitry such as hardware including logic circuits; a hardware/software combination such as a processor executing software; or a combination thereof. For example, the processing circuity more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc.

The present embodiments may be implemented as a form of recording medium containing computer-executable instructions, such as program modules executed by a computer. A computer-readable medium may include any available medium accessible by a computer, and may include all of volatile and non-volatile media and detachable and non-detachable media. Furthermore, the computer-readable medium may include all of computer storage media and communication media. The computer storage media include all of volatile and non-volatile media and detachable and non-detachable media implemented by any method or technology for storing information such as computer-readable instructions, data structures, program modules, and/or other data. The communication media may typically include other data of modulated data signals such as computer-readable instructions, data structures, and program modules, or other transmission mechanisms, and include any information delivery media.

The above description is merely illustrative, and it would be easily understood that those of ordinary skill in the art could easily make modifications without departing from the technical concept of the present disclosure or changing essential features. Therefore, the above embodiments should be considered illustrative and should not be construed as limiting. For example, each component described as a single type may be distributed, and likewise, components described as being distributed may be implemented as a combined form.

According to the present disclosure, a crossbar array including a plurality of nonvolatile memory devices may have photoconductivity characteristics, and thus may be used to store/acquire an image due to the characteristics.

Furthermore, according to the present disclosure, a crossbar array may perform a vector-matrix operation, and the crossbar array may be used for training and inference processes of a neural network by using this characteristic.

Furthermore, according to the present disclosure, a crossbar array used in an imaging mode (image storing/acquisition) may be used in a recognition mode (neural network training/inference) after being reset. Accordingly, the imaging mode and the recognition mode may be performed using a single crossbar array.

It should be understood that embodiments described herein should be considered in a descriptive sense only and not for purposes of limitation. Descriptions of features or aspects within each embodiment should typically be considered as available for other similar features or aspects in other embodiments. While one or more example embodiments have been described with reference to the figures, it will be understood by those of ordinary skill in the art that various changes in form and details may be made therein without departing from the spirit and scope as defined by the following claims.

What is claimed is:

1. A electronic device comprising:
    a resistance switching layer having a resistance value, the resistance switching layer configured to change the resistance value based on an illumination of light irradiated thereto, and the resistance switching layer configured to maintain the changed resistance value;
    a gate on the resistance switching layer;
    a gate oxide layer between the resistance switching layer and the gate;
    a source and a drain, spaced part from each other, on the resistance switching layer; and
    a color filter arranged on the resistance switching layer,
    wherein the resistance switching layer includes charge traps configured to trap charges in the resistance switching layer such that the change in the resistance value of the resistance switching layer generated by the illumination of the light is maintained after the illumination.

2. The electronic device of claim 1, wherein the gate includes a transparent conducting electrode (TCE) gate above the resistance switching layer and configured to transmit the irradiated light.

3. The electronic device of claim 1, wherein the resistance switching layer includes a 2-dimensional (2D) material, the 2D material including at least one of a transition metal dichalcogenide (TMD), silicene, phosphorene (black phosphorus), or graphene.

4. The electronic device of claim 3, wherein the resistance switching layer is a single-layer.

5. The electronic device of claim 3, wherein the resistance switching layer is a multi-layer.

6. The electronic device of claim 1, wherein the resistance switching layer includes a 3-dimensional (3D) material, the 3D material including at least one of germanane, silicon, a group III-V semiconductor, or IGZO.

7. The electronic device of claim 1, wherein the gate oxide layer is a multi-layer including a charge trapping layer.

8. The electronic device of claim 1, wherein the change of the resistance value of the resistance switching layer includes, in a state in which an off-voltage is applied to the gate, decreasing the resistance value of the resistance switching layer as the illumination of the light irradiated to the resistance switching layer increases.

9. The electronic device of claim 1, wherein the resistance switching layer is configured to reset the resistance value when an on-voltage is applied to the gate.

10. A memory system comprising:
    a crossbar array including
        a plurality of presynaptic neurons,
        a plurality of postsynaptic neurons, and
        a plurality of synapses connecting the plurality of presynaptic neurons and the plurality of postsynaptic neurons, each of the plurality of synapses including the electronic device of claim 1; and
    a processor configured to obtain a source current from each column of the crossbar array.

11. The memory system of claim 10, wherein the processor is configured to perform a vector-matrix operation of a neural network by applying a gate off-voltage to at least one row of the crossbar array and obtaining the source current from each of the columns of the crossbar array.

* * * * *